US008183713B2

(12) United States Patent
Rao et al.

(10) Patent No.: US 8,183,713 B2
(45) Date of Patent: May 22, 2012

(54) SYSTEM AND METHOD OF PROVIDING POWER USING SWITCHING CIRCUITS

(75) Inventors: Hari Rao, San Diego, CA (US); Nan Chen, San Diego, CA (US); Ritu Chaba, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 604 days.

(21) Appl. No.: 11/962,195

(22) Filed: Dec. 21, 2007

(65) Prior Publication Data

US 2009/0160253 A1 Jun. 25, 2009

(51) Int. Cl.
*H02J 3/14* (2006.01)
(52) U.S. Cl. .......................................... 307/38
(58) Field of Classification Search ............. 307/38
See application file for complete search history.

(56) References Cited

U.S. PATENT DOCUMENTS

| 6,903,946 | B1 | 6/2005 | Wu |
| 6,982,885 | B2 | 1/2006 | Huang |
| 7,330,362 | B2 | 2/2008 | Hensener |
| 7,659,746 | B2 | 2/2010 | Chua-Eoan et al. |
| 2004/0155614 | A1* | 8/2004 | Osinga et al. ............... 318/280 |
| 2008/0259843 | A1* | 10/2008 | Cai ............................. 370/328 |

OTHER PUBLICATIONS

International Search Report—PCT/US08/087752, International Search Authority—European Patent Office—May 6, 2009.
Written Opinion—PCT/US08/087752, International Search Authority—European Patent Office—May 6, 2009.

* cited by examiner

*Primary Examiner* — Rexford Barnie
*Assistant Examiner* — Dru M Parries
(74) *Attorney, Agent, or Firm* — Nicholas J. Pauley; Peter Michael Kamarchik; Jonathan T. Velasco

(57) ABSTRACT

In a particular illustrative embodiment, a system is disclosed that includes a first power domain that is responsive to a first power switching circuit and a second power domain that is responsive to a second power switching circuit. The system also includes a logic circuit adapted to selectively activate the first power switching circuit and the second power switching circuit. At least one of the first power switching circuit and the second power switching circuit includes a first set of transistors adapted for activation during a first power up stage and a second set of transistors adapted for activation during a second power up stage after at least one of the first set of transistors are activated.

26 Claims, 8 Drawing Sheets

SYSTEM AND METHOD OF PROVIDING POWER USING SWITCHING CIRCUITS

FIELD

The present disclosure is generally related to a system and method of providing power using switching circuits.

DESCRIPTION OF RELATED ART

In general, integrated circuit devices can include multiple circuit components, which are powered from a power source. Conventionally, mobile telephones and other portable computing devices include integrated circuits, such as processors, memory circuits, and other types of circuits, which rely on a portable power source, such as a battery. Accordingly, it is desirable to reduce overall power consumption in order to extend the battery life of the devices.

In some circuits, leakage currents represent a significant drain on power resources. While head switches or foot switches are sometimes used to reduce leakage currents, the activation and deactivation of such switches can introduce large current spikes. In particular, a power grid of a circuit device may represent a large capacitance (C). When a head switch or foot switch is activated to enable charging of the power grid, a large instantaneous current ($i_{power\_up}$) may be introduced. For example, the rail-to-rail charging of the power grid from a voltage level at or near an electrical ground voltage level to a voltage level (VDDx) that is approximately equal to a supply voltage level (e.g., VDD) can introduce a significant current $$\left(e.g., i_{power\_up} = C\frac{dVDDx}{dt}\right).$$

Such a large instantaneous current ($i_{power\_up}$) may lead to power supply buckling and possible metal interconnect electromigration. In addition, when a particular memory block is going through power cycling, noise may be introduced into neighboring blocks in terms of power supply IR drop.

SUMMARY

In a particular illustrative embodiment, a system is disclosed that includes a first power domain that is responsive to a first power switching circuit and a second power domain that is responsive to a second power switching circuit. The system also includes a logic circuit adapted to selectively activate the first power switching circuit and the second power switching circuit. At least one of the first power switching circuit or the second power switching circuit includes a first set of transistors adapted for activation during a first power up stage and a second set of transistors adapted for activation during a second power up stage after at least one of the first set of transistors are activated.

In another particular embodiment, a method of providing power to a device is disclosed that includes selectively activating a first set of transistors during a first power up stage to pre-charge a power rail to a voltage level that is less than a supply voltage level of a power supply. The method also includes activating a second set of transistors during a second power up stage after at least one of the first set of transistors is activated during the first power up stage.

In still another particular embodiment, during a first stage, a method includes drawing a first current having a first signal characteristic. During a second stage, the method includes drawing a second current having a second signal characteristic, where the second characteristic includes a saw tooth type pattern.

In yet another particular embodiment, a wireless communication device is disclosed that includes an antenna, a wireless controller coupled to the antenna, and a processor coupled to the wireless controller. The wireless communication device also includes a power switching circuit including a first set of transistors and a second set of transistors and a power control logic circuit coupled to the power switching circuit. The power control logic circuit is adapted to selectively activate the first set of transistors during a first power up stage and to activate the second set of transistors during a second power up stage.

One particular advantage provided by embodiments of the power switching circuit is provided in that a surge current associated with charging of a power grid is reduced.

Another particular advantage is that, by turning on a first set of transistors (trickle devices) and then turning on a second set of transistors (flood devices), a power grid can be pre-charged to a voltage level that is less than a supply voltage level and the power grid is then ramped to the supply voltage level, reducing a surge current due to a capacitance associated with the power grid. In a particular example, the power grid may be pre-charged to approximately half of the supply voltage level $$\left(i.e., \frac{VDD}{2}\right).$$

Once the power grid is pre-charged, the second set of transistors can be activated to charge the power grid to the supply voltage level (VDD). By providing power to the power grid in stages, a surge current during a power-up process is reduced.

Yet another advantage is that low power circuitry, which is coupled to a power grid of a circuit, is protected from power up or wake up related surge currents. In particular, embodiments of the power switching circuit can provide a controlled power up sequence to reduce power supply surge currents to a level that does not lead to power supply buckling or metal interconnect electromigration and to reduce noise that is introduced into neighboring blocks in terms of power supply IR drop.

Still another particular advantage is provided in that the reduced surge currents also reduce cross-coupling noise and enhance power supply noise immunity between adjacent banks of devices.

Another advantage is provided in that distributing head switches in the form of a two-dimensional grid enables power supply grid design with very low instantaneous IR drop and high speed switching.

Other aspects, advantages, and features of the present disclosure will become apparent after review of the entire application, including the following sections: Brief Description of the Drawings, Detailed Description, and the Claims.

DETAILED DESCRIPTION

Figure 1:
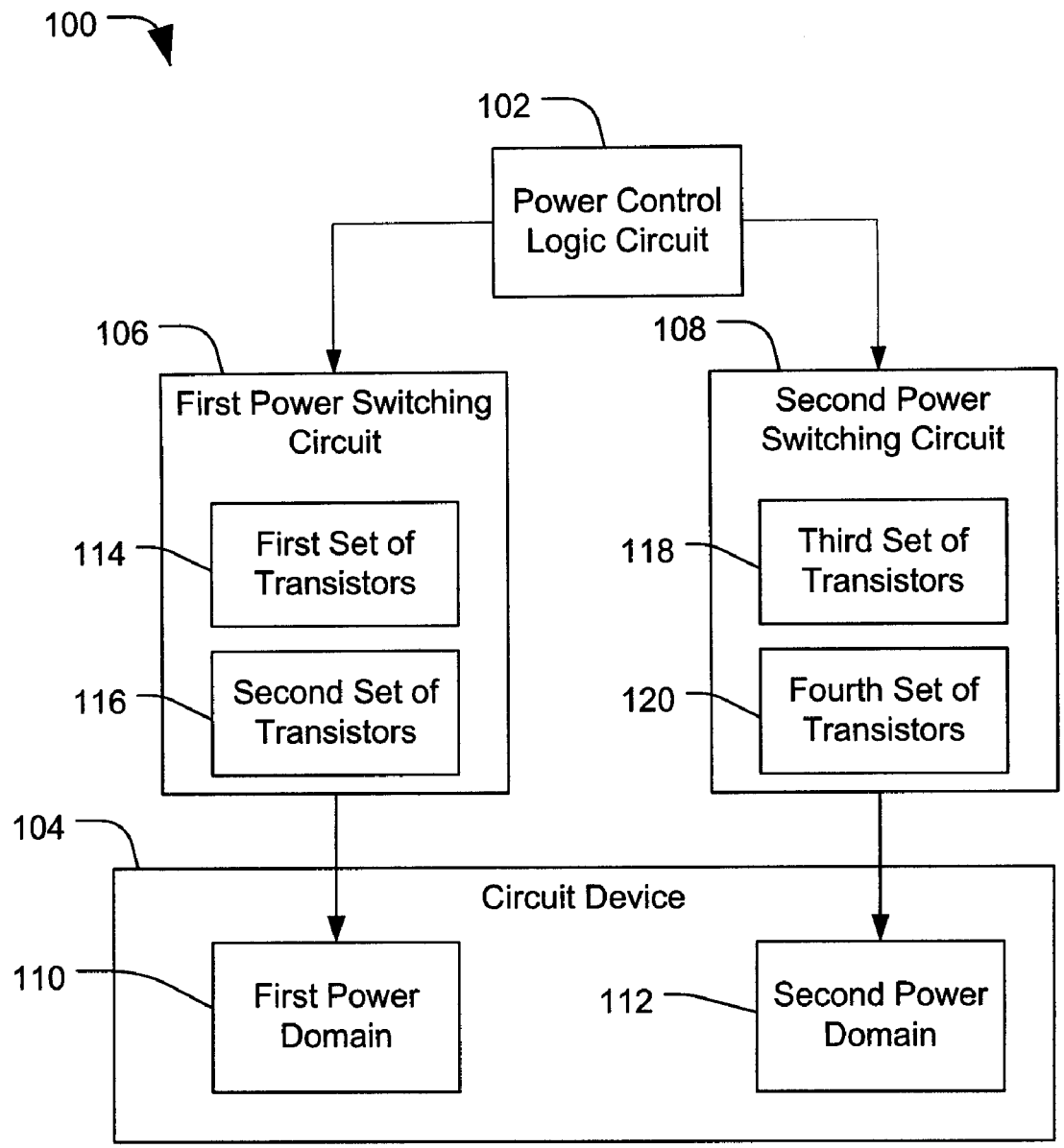
FIG. 1 is a block diagram of a particular illustrative embodiment of a circuit device to provide power using switching circuits.

FIG. 1 is a block diagram of a particular illustrative embodiment of a circuit device 100 to provide power using switching circuits. The circuit device 100 includes a power control logic circuit 102 that is responsive to a circuit device 104 via a first power switching circuit 106 and a second power switching circuit 108. The power control logic circuit 102 is adapted to selectively activate the first power switching circuit 106 and the second power switching circuit 108. The circuit device 104 includes a first power domain 110 that is responsive to the first power switching circuit 106 and a second power domain 112 that is responsive to the second power switching circuit 108. The first power switching circuit 106 includes a first set of transistors 114 and a second set of transistors 116. The second power switching circuit 108 includes a third set of transistors 118 and a fourth set of transistors 120. The first, second, third, and fourth sets of transistors 114, 116, 118, and 120 may include p-channel transistors, n-channel transistors, or any combination thereof. In a particular embodiment, the first, second, third, and fourth sets of transistors 114, 116, 118, and 120 are p-channel transistors.

In a particular embodiment, the circuit device 104 may include multiple circuits. Additionally, the first and second power domains 110 and 112 may represent a circuit device. In a particular example, the circuit device 104 may be a memory device including a memory array, and the first and second power domains 110 and 112 can be portions of a memory, such as a sub-array or memory block within the memory array. In another particular example, the circuit device 104 can be a digital signal processor including multiple processor circuits, and the first and second power domains 110 and 112 represent portions of the digital signal processor, such as a sub-circuit of the digital signal processor.

In a particular illustrative embodiment, during a power up process, the power control logic circuit 102 is adapted to selectively activate at least one of the first set of transistors 114 and the second set of transistors 116 of the first power switching circuit 106 to provide power to the first power domain 110 of the circuit device 104. In another particular illustrative embodiment, during the power up process, the power control logic circuit 102 can selectively activate at least one of the third set of transistors 118 and the fourth set of transistors 120 of the second power switching circuit 108 to provide power to the second power domain 112 of the circuit device 104.

In a particular illustrative embodiment, the first power switching circuit 106 and the second power switching circuit 108 are controlled by the power control logic circuit 102 to provide a power supply in power stages to the first and second power domains 110 and 112 of the circuit device 104. For example, during a first power stage, the first set of transistors 114 is activated to pre-charge a power rail of the circuit device 104 to a voltage level that is less than a supply voltage level associated with a power supply. In a particular example, a power supply may have a power supply level (VDD), and the first set of transistors 114 is adapted to pre-charge the power rail to a voltage level that is approximately equal to half of the power supply voltage level (i.e., approximately VDD/2). During a second power stage, the second set of transistors 116 is activated to provide power to the power rail after at least one of the first set of transistors is activated.

In a particular illustrative embodiment, the circuit device 104 is a memory device and the first power domain 110 and the second power domain 112 represent independent memory cells within the memory device. In another particular embodiment, the first power domain 110 is associated with a discrete circuit component, an electrical load, a sub-circuit, a circuit driver, another circuit device, or any combination thereof. In another particular embodiment, the power control logic circuit 102 includes a decoder to selectively deactivate the first power domain 110 or the second power domain 112 by selectively deactivating the first power switching circuit 106 or the second power switching circuit 108.

In a particular illustrative embodiment, the first power domain 110 of the circuit device 104 operates in a reduced power mode, such as a sleep mode, during a period of inactivity. In response to activation, a wakeup instruction, an interrupt, another indicator, or any combination thereof, the power control logic circuit 102 sends a power up signal to the first power switching circuit 106, activating the first set of transistors 114 to pre-charge a power supply rail associated with the first power domain 110 of the circuit device 104. After at least one transistor of the first set of transistors 114 is active, the second set of transistors 116 is activated to provide power to the power rail. In a particular example, the second set of transistors 116 includes a plurality of transistors that are wider and conduct more current than the transistors of the first set of transistors 114. In a particular embodiment, the first and second sets of transistors 114 and 116 may be selectively activated via control signals from the power control logic circuit 102. In another particular embodiment, the first and second sets of transistors 114 and 116 are electrically coupled such that a single control signal from the power control logic circuit 102 activates the first set of transistors 114 and the second set of transistors 116. In a particular embodiment, activation of the second set of transistors 116 may be delayed relative to activation of the first set of transistors 114.

In a particular embodiment, the power control logic circuit 102 selectively activates the third set of transistors 118 during the first power up stage to pre-charge a second power rail associated with the second power domain 112 of the circuit device 104. The second power rail may be charged to a supply voltage level that is approximately equal to half of the voltage level of the power supply. The fourth set of transistors 120 is activated during the second power up stage, after at least one of the third set of transistors 118 is activated.

Figure 2:
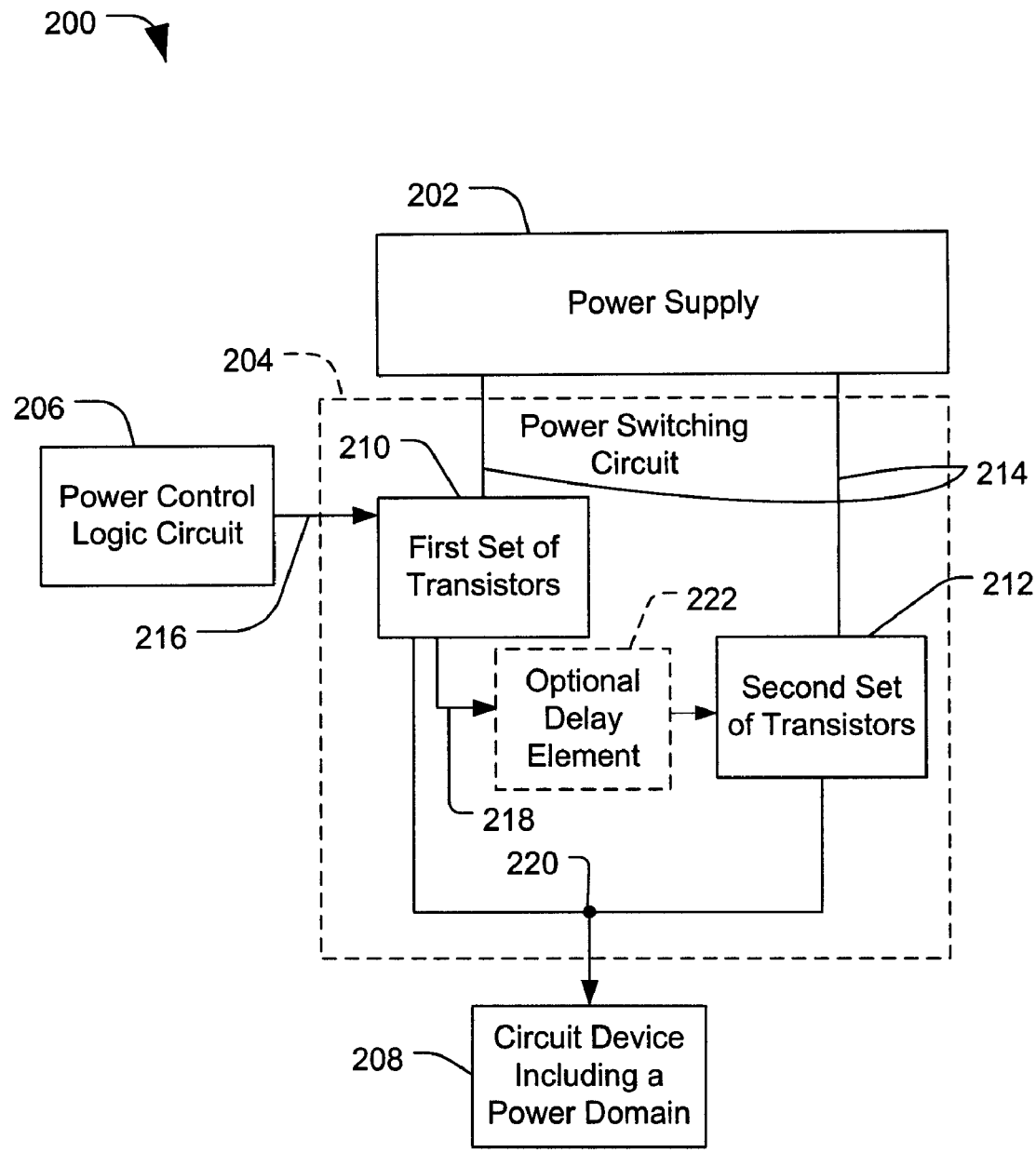
FIG. 2 is a block diagram of a second particular illustrative embodiment of a circuit device to provide power using switching circuits.

FIG. 2 is a block diagram of a second particular illustrative embodiment of a circuit device 200 to provide power using a switch circuit. A power supply 202 is coupled to a power switching circuit 204, which is responsive to a power control logic circuit 206. The power switching circuit 204 is also coupled to a circuit device including a power domain 208. The power switching circuit 204 includes a first set of transistors 210, a second set of transistors 212, and an optional delay element 222. The first and second sets of transistors 210 and 212 are coupled to the power supply 202 via terminals 214. The first set of transistors 210 is coupled to the power control logic circuit 206 via a control terminal 216. The first set of transistors 210 is coupled to the second set of transistors 212 via a feedback loop 218. Optionally, the first set of transistors 210 is coupled to the second set of transistors 212 via the optional delay element 222.

In a particular illustrative embodiment, the power control logic circuit 206 selectively activates the first set of transistors 210 via a control signal at a control line 216. At least one transistor of the first set of transistors 210 is activated to pre-charge a node 220, which may represent or be coupled to a power supply rail of the circuit device including the power domain 208. After activation of at least one of the transistors of the first set of transistors 210, the control signal is propagated via the feedback loop 218 to activate the second set of transistors 212 to fully charge the node 220 to a desired power supply voltage level. In a particular illustrative embodiment, the control signal at the feedback loop 218 may be delayed using the optional delay element 222 to delay activation of the second set of transistors 212. For example, depending on the size of the transistors of the first set of transistors 210, a delay may be desirable to allow time for the first set of transistors 210 to pre-charge the node 220 before the second set of transistors 212 is activated.

In a particular embodiment, by charging the node 220 (i.e., the power rail of the circuit device including the power domain 208) in stages, a power up surge current is reduced. By reducing a power up current surge, low power circuitry coupled to the node 220 may be protected. In particular, since mobile devices often use sleep modes and other reduced power modes to reduce power consumption during periods of inactivity, power up from a sleep mode occurs frequently, and, unless the power up process is controlled, frequent (repeated) sleep/power up sequences may damage low power circuitry due to instantaneous surge currents. By staging the power up process, such surge currents are limited to protect low power circuitry.

Figure 3:
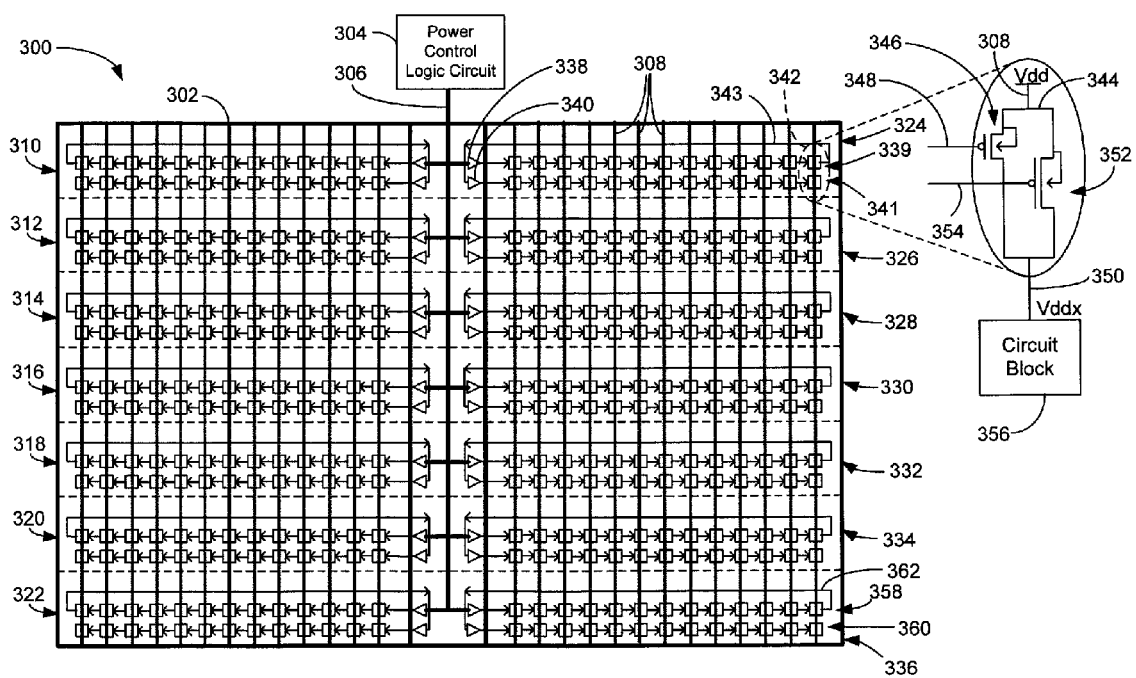
FIG. 3 is a block diagram of a third particular illustrative embodiment of a circuit device to provide power to a circuit.

FIG. 3 is a block diagram of a third particular illustrative embodiment of a circuit device 300 to provide power using switching circuits. The circuit device 300 includes a substrate 302 having a control terminal 306 that is coupled to a power control logic circuit 304. The substrate 300 also includes a plurality of power supply rails 308. Additionally, the substrate 300 includes a plurality of banks 310, 312, 314, 316, 318, 320, 322, 324, 326, 328, 330, 332, 334, and 336, which may be independently activated to selectively provide power to one or more power domains of associated circuitry. The bank 324 includes a first driver circuit 338 that is coupled to the control terminal 306 and to a first set of transistors 339 and includes a second driver circuit 340 that is coupled to a second set of transistors 341 and to a feedback loop 343 that is coupled to the first set of transistors 339. In particular, the feedback loop 343 couples the gates of the first set of transistors 339 to the gates of the second set of transistors 341. In general, each of the banks 310, 312, 314, 316, 318, 320, 322, 324, 326, 328, 330, 332, 334, and 336 includes a first set of transistors and a second set of transistors. For example, the bank 336 includes a first set of transistors 358 and a second set of transistors 360 coupled to the first set of transistors 358 by a feedback loop 362.

A first transistor 346 from the first set of transistors 339 and a second transistor 352 from the second set of transistors 341 are illustrated in an exploded view 342. The first transistor 346 includes a first terminal that is coupled to a node 344, which is coupled to the power supply rail 308. The first transistor 346 also includes a control terminal 348 that is coupled to the gates of each of the other transistors of the first set of transistors 339, which are coupled to the first driver circuit 338. The first transistor 346 also includes a third terminal that is coupled to a node 350. The first transistor 346 can be selectively activated by a control signal from the power control logic circuit 304 to pre-charge the node 350. The second transistor 352 includes a first terminal that is coupled to the node 344. The second transistor 352 also includes a control terminal 354 that is coupled to the gates of each of the other transistors of the second set of transistors 341, which are coupled to the second driver circuit 340. The second transistor 352 also includes a third terminal that is coupled to the node 350. The gates of the first set of transistors 339, including the control terminal 348 of the first transistor 346, are electrically coupled to the gates of the second set of transistors 341, including the control terminal 354 of the second transistor 352, via the feedback loop 343. In a particular embodiment, the second transistor 352 is activated after at least one transistor of the first set of transistors 339 is activated. In a particular example, the feedback loop 343 may introduce a delay in the activation of the second set of transistors 341, such that the second transistor 352 is activated after at least one of the first set of transistors 339 is activated. Upon activation, the second transistor 352 and the other transistors of the second set of transistors 341 are adapted to fully charge the node 350 to provide power to the power domain of the circuit block 356.

In a particular illustrative embodiment, the power control logic circuit 304 includes a decoder to selectively activate a selected bank of the plurality of banks 310, 312, 314, 316, 318, 320, 322, 324, 326, 328, 330, 332, 334, and 336 in order to provide power to a selected power domain. In a particular embodiment, each of the transistors of the first and second sets of transistors 339 and 341 can be p-channel metal oxide semiconductor field effect transistors (MOSFETS or PMOS devices).

Figure 4:
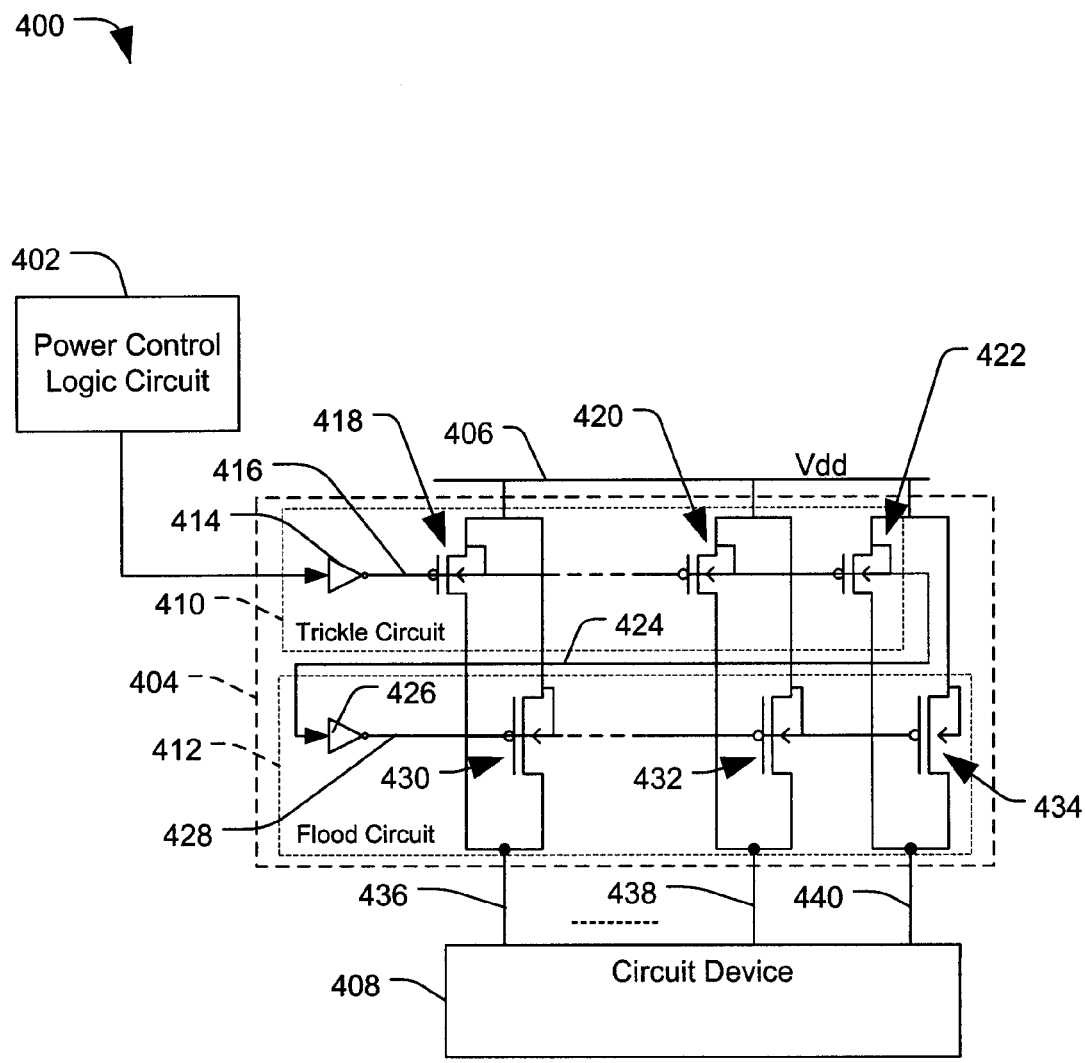
FIG. 4 is a block diagram of a third particular illustrative embodiment of a circuit device to provide power to a power domain of a circuit device.

FIG. 4 is a block diagram of a third particular illustrative embodiment of a device 400 to provide power to a circuit device. The device 400 includes a power control logic circuit 402 that is coupled to a power switching circuit 404 to selectively provide power from a power supply terminal 406 to one or more power domains of a circuit device 408. The power switching circuit 404 includes a trickle circuit 410 adapted to pre-charge the power supply nodes 436, 438 and 440 and includes a flood circuit 412 to fully charge the power supply nodes 436, 438, and 440. The trickle circuit 410 includes a first driver circuit 414 to provide a control signal to a control terminal 416 of p-channel transistors 418, 420 and 422. The control terminals (i.e., gates) of the p-channel transistors 418, 420, and 422 are electrically coupled to each other. Each of the p-channel transistors 418, 420, and 422 are coupled to the power supply terminal 406 and to a respective one of the nodes 436, 438, and 440. A feedback loop 424 couples the gate of the p-channel transistor 422 to a second driver circuit 426 of the flood circuit 412. The flood circuit 412 includes the driver circuit 426 to provide a control signal to a control terminal 428 of p-channel transistors 430, 432, and 434. The control terminals (i.e., gates) of the p-channel transistors 430, 432 and 434 are electrically coupled. Additionally, each of the p-channel transistors 430, 432 and 434 are coupled to the power supply terminal 406 and to a respective one of the nodes 436, 438 and 440.

In a particular illustrative embodiment, the power control logic circuit 402 is adapted to selectively activate the power switching circuit 404 by providing a control signal to the trickle circuit 410, which activates each of the transistors 418, 420 and 422 to pre-charge the respective nodes 436, 438 and 440 to a power level that is less than a voltage level of the power supply terminal 406. It should be understood that the trickle circuit 410 may include any number of transistors to pre-charge any number of respective nodes. The second driver circuit 426 of the flood circuit 412 may provide a delay for the control signal received via the feedback loop 424. The transistors 430, 432, and 434 of the flood circuit 412 may be activated by the control signal received via the feedback loop 424 to further charge the respective nodes 436, 438, and 440. It should be understood that the flood circuit 412 may include any number of transistors to charge any number of respective nodes.

In a particular embodiment, the transistors 430, 432 and 434 of the flood circuit 412 are wider than the transistors 418, 420 and 422 of the trickle circuit 410. The wider transistors 430, 432 and 434 conduct more current than the transistors of the trickle circuit 410. In a particular embodiment, the trickle circuit 410 is activated first to pre-charge a virtual power supply at the nodes 436, 438, and 440 to approximately half of the power supply voltage (i.e., approximately Vdd/2). The driver circuit 426 of the flood circuit 412 is then activated to ramp the virtual power supply at the nodes 436, 438, and 440 to approximately the power supply voltage (i.e., approximately Vdd), thereby limiting a surge current during power-up.

In general, while the circuit devices of FIGS. 1-4 have illustrated two sets of transistors (i.e., a trickle circuit 410 and a flood circuit 412), it should be understood that multiple stages may be included in the power switching circuits to provide additional pre-charge voltage levels. For example, if the power switching circuit includes four sets of transistors, the power switching device may switch a power level at a node during four stages, each of which contributes approximately one-fourth of the power supply voltage level to the node that is coupled to a power domain of a circuit device. Depending on a particular implementation, any number of sets of transistors may be included to provide additional pre-charge power stages.

Figure 5:
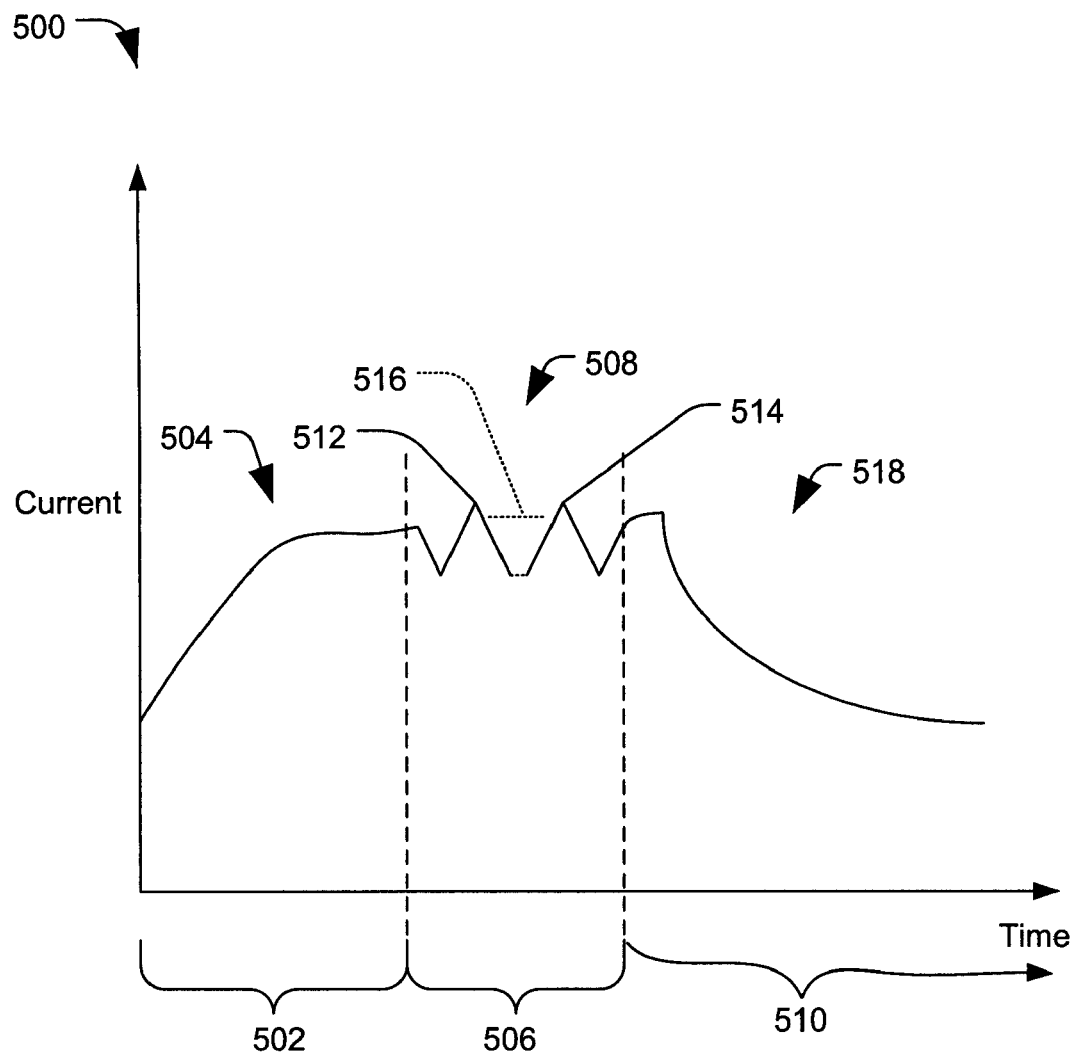
FIG. 5 is a diagram of a particular illustrative embodiment of a power supply current at a power supply coupled to one of the power delivery circuit devices of FIGS. 1-4.

FIG. 5 is a diagram 500 of a particular illustrative embodiment of a power supply current at a power supply coupled to one of the circuit devices of FIGS. 1-4. The diagram 500 illustrates a first stage 502 having a first current 504 with a first signal characteristic. In a particular embodiment, the first signal characteristic represents a ramp up to a substantially constant current. The diagram 500 also illustrates a second stage 506 that has a second current 508 having a second signal characteristic. The second signal characteristic represents a saw tooth type pattern. In a particular embodiment, the second signal characteristic includes a first saw tooth signal element 512 and a second saw tooth signal element 514. The diagram 500 also illustrates a third stage 510 that includes a third signal characteristic 518.

In a particular illustrative embodiment, the first stage 502 represents a first power up stage associated with activation of a first set of transistors, such as the first set of transistors 339 illustrated in FIG. 3. In another particular illustrative embodiment, the second stage represents a second power up stage associated with activation of a second set of transistors, such as the second set of transistors 341 illustrated in FIG. 3. In a particular illustrative embodiment, the saw tooth type pattern includes a number of saw tooth signal elements, such as the first and second saw tooth signal elements 512 and 514. The second stage may include any number of saw tooth signal elements, as indicated by the dashed line 516. The particular number of saw tooth signal elements, such as the saw tooth signal elements 512 and 514, may represent a number of transistors of at least the second set of transistors. In another particular embodiment, the number of saw tooth signal elements may represent a number of stages or sets of transistors that are included in the power switching circuit.

Figure 6:
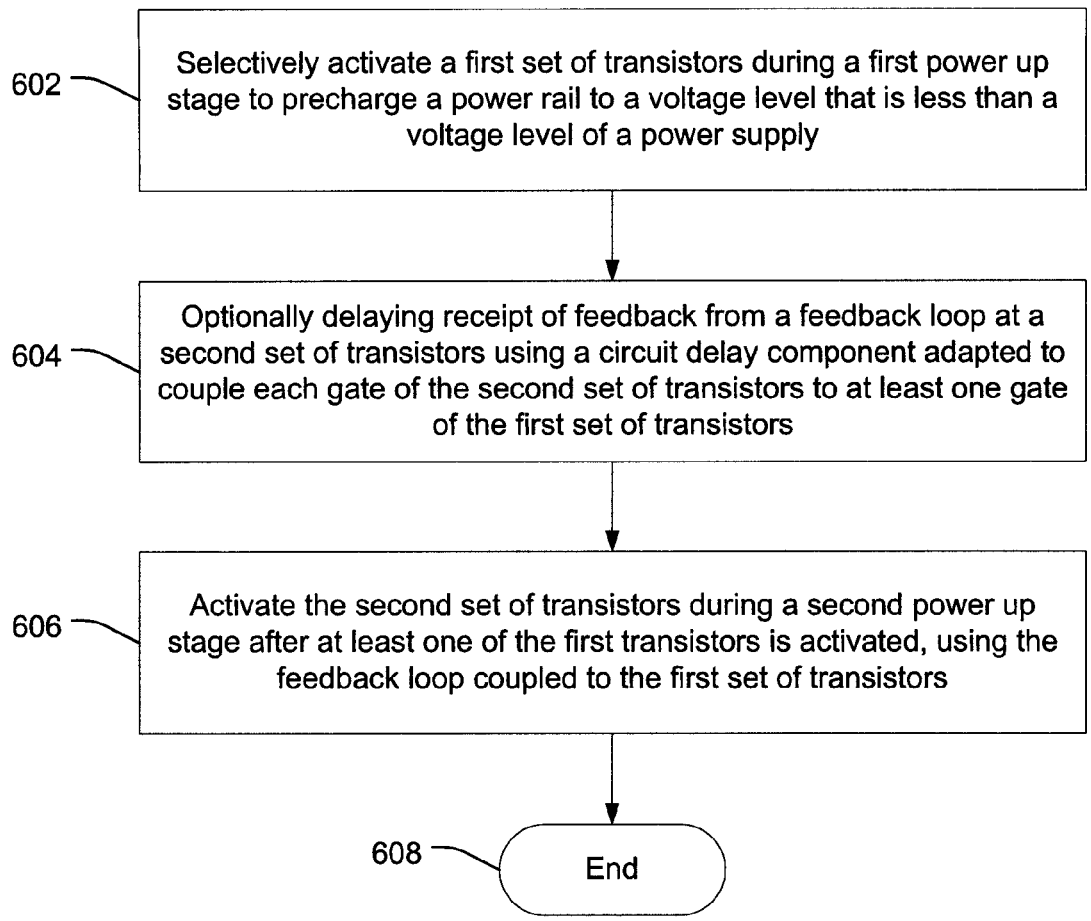
FIG. 6 is a flow diagram of a particular illustrative embodiment of a method of providing power to using switching circuits.

FIG. 6 is a flow diagram of a particular illustrative embodiment of a method of providing power using switching circuits. At 602, a first set of transistors is selectively activated during a first power up stage to pre-charge a power rail to a voltage level that is less than a supply voltage level of a power supply. In a particular illustrative embodiment, each gate of the first set of transistors is electrically coupled. Continuing to 604, feedback is received from a feedback loop at a second set of transistors using a circuit delay component adapted to couple each gate of the second set of transistors to at least one gate of the first set of transistors. Moving to 606, the second set of transistors is activated during a second power up stage after at least one of the first set of transistors is activated, using a feedback loop coupled to the first set of transistors. In a particular illustrative embodiment, during the second power up stage, the first and second sets of transistors may be activated to draw a current from the power supply to charge one or more supply rails, where the current has a saw tooth type characteristic. The method terminates at 608.

In a particular illustrative embodiment, the first set of transistors and the second set of transistors include p-channel transistor devices. In another particular illustrative embodiment, the first set of transistors and the second set of transistors include n-channel transistor devices. In a particular illustrative embodiment, the first set of transistors includes narrow-width transistor devices and the second set of transistors includes wide-width transistor devices. In still another particular embodiment, the first set of transistors and the second set of transistors are coupled to the power supply. In a particular embodiment, the first set of transistors and the second set of transistors are coupled in parallel between the power supply and a power domain associated with a circuit device. In a particular illustrative embodiment, the first and second sets of transistors reduce a leakage current from the power supply to a circuit device when the first and second sets of transistors are inactive. For example, when the first and second sets of transistors are inactive, the power supply does not supply power to supply rails of a circuit device. The first and second sets of transistors may operate as a foot switch or a head switch to prevent current flow from the power supply to the circuit device. During periods of inactivity, the first and second sets of transistors may be deactivated prevent a current path from the power source to the circuit device, thereby reducing current leakage.

Figure 7:
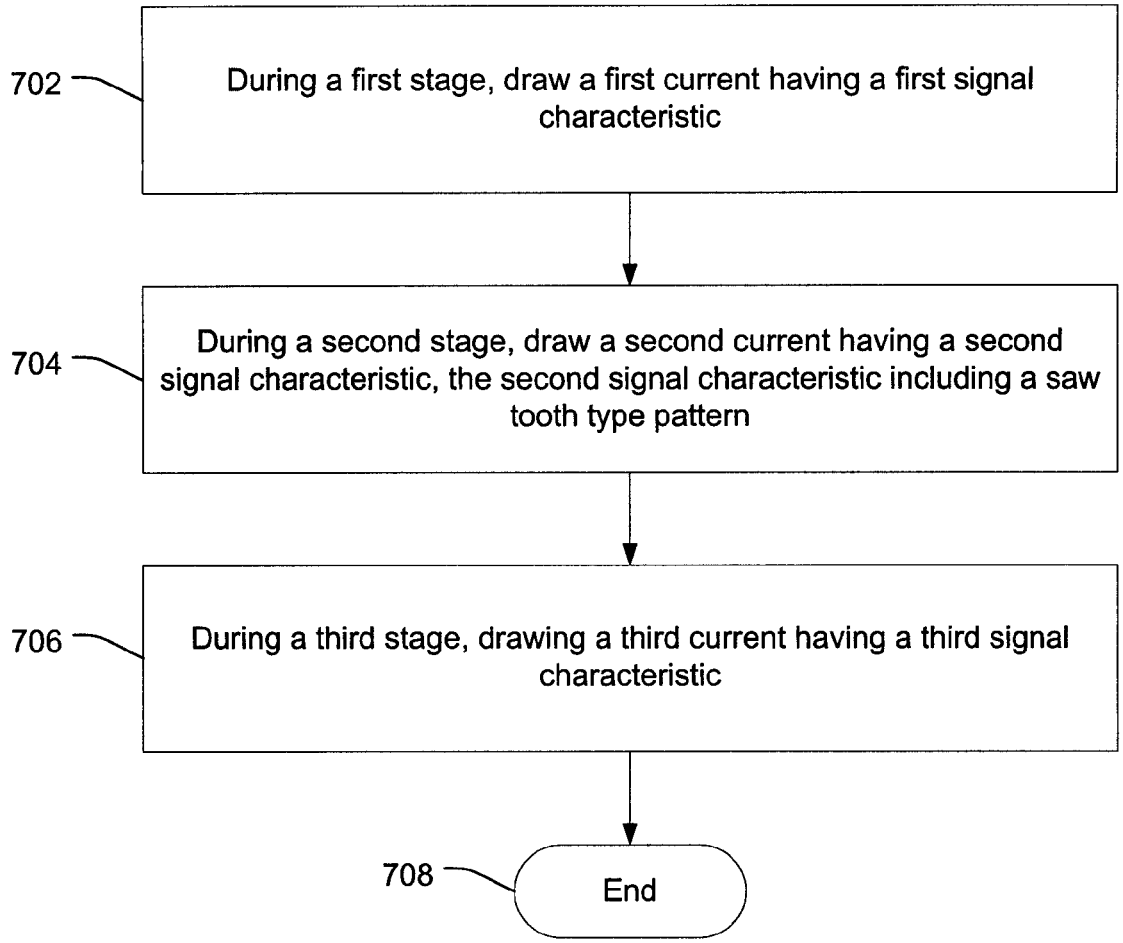
FIG. 7 is a flow diagram of a second particular illustrative embodiment of a method of providing power using switching circuits.

FIG. 7 is a flow diagram of a second particular illustrative embodiment of a method of providing power using power stages. At 702, a first current is drawn with a first signal characteristic during a first stage. In a particular illustrative embodiment, the first signal characteristic includes a current level that is substantially constant. Advancing to 704, a second current is drawn during a second stage that has a second signal characteristic, where the second signal characteristic includes a saw tooth type pattern. In a particular illustrative embodiment, the saw tooth type pattern includes a number of saw tooth signal elements that corresponds to a number of transistors of at least the second set of transistors. In a particular embodiment, the first stage includes a first power up stage associated with activation of a first set of transistors and the second stage includes a second power up stage associated with activation of a second set of transistors. Continuing to 706, a third current is drawn during a third stage, where the third current has a third signal characteristic. The method terminates at 708.

Figure 8:
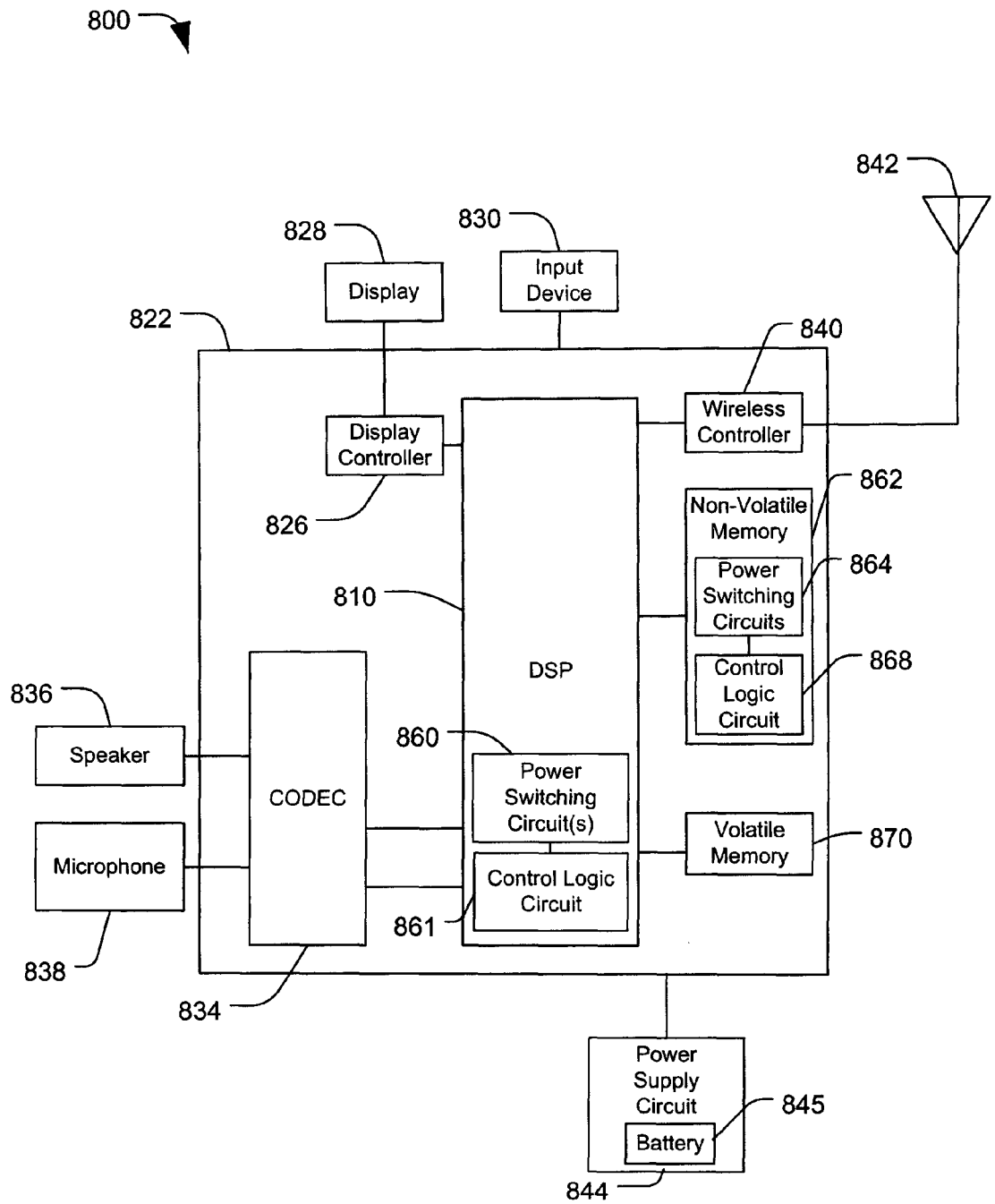
FIG. 8 is a block diagram of a representative wireless communication device that may include any of the circuits illustrated in FIGS. 1-4.

FIG. 8 is a block diagram of a representative wireless communication device 800 that may include the circuits illustrated in FIGS. 1-4. The communications device 800 includes one or more power switching circuits 860 coupled to a control logic circuit 861 and one or more power switching circuits 864 coupled to a control logic circuit 868. The one or more power switching circuits 860 and 864 and the control logic circuits 864 and 868 are adapted to provide power to respective power domains, as described with respect to FIGS. 1-7. In a particular illustrative embodiment, the one or more power switching circuits 860 and the control logic circuit 861 may be included in a digital signal processor (DSP) 810. The one or more power switching circuits 864 may be included in a non-volatile memory 862, such as a flash memory, a hard disk, other non-volatile memory, or any combination thereof. Additionally, the control logic 868 may be included in the non-volatile memory 862 or may be adapted to communicate with the one or more power switching circuits 864 within the non-volatile memory 862. In another particular embodiment, the communications device 800 may also include a volatile memory 870, such as a random access memory (RAM), a magnetic RAM (MRAM), other volatile memory devices, or any combination thereof, any of which may include the one or more power switching circuits, such as the power switching circuits described with respect to FIGS. 1-4. Such volatile memory 870 may also include control logic, such as the control logic 868.

FIG. 8 also shows a display controller 826 that is coupled to the digital signal processor 810 and to a display 828. A coder/decoder (CODEC) 834 can also be coupled to the digital signal processor 810. A speaker 836 and a microphone 838 can be coupled to the CODEC 834.

FIG. 8 also indicates that a wireless controller 840 can be coupled to the digital signal processor 810 and to a wireless antenna 842. In a particular embodiment, an input device 830 and a power supply 844 are coupled to the on-chip system 822. Moreover, in a particular embodiment, as illustrated in FIG. 8, the display 828, the input device 830, the speaker 836, the microphone 838, the wireless antenna 842, and the power supply 844 are external to the on-chip system 822. However, each can be coupled to a component of the on-chip system 822, such as an interface or a controller. In a particular embodiment, the power supply 844 may include a battery 845.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A method of providing power to a device, the method comprising:
   selectively activating a first set of transistors during a first power up stage to precharge a power rail to a voltage level that is less than a supply voltage level of a power supply; and
   activating a second set of transistors during a second power up stage after at least one transistor of the first set of transistors is activated during the first power up stage, wherein the second set of transistors is activated responsive to a signal sent via a feedback loop having a circuit delay component coupled to a gate of the at least one transistor of the first set of transistors.

2. The method of claim 1, wherein, during the second power up stage, the first and second sets of transistors draw a current having a saw tooth type characteristic from the power supply.

3. The method of claim 1, wherein the first set of transistors includes narrow width transistor devices and the second set of transistors include wide-width transistor devices.

4. The method of claim 1, wherein the first set of transistors and the second set of transistors are coupled to the power supply.

5. The method of claim 1, wherein the first set of transistors and the second set of transistors are coupled in parallel between the power supply and a power domain associated with a circuit device.

6. The method of claim 1, wherein each transistor of the first set of transistors includes a gate, wherein the gates of the first set of transistors are electrically coupled to each other.

7. The method of claim 1, wherein the circuit delay component is adapted to couple each gate of the second set of transistors to the gate of the at least one transistor of the first set of transistors.

8. The method of claim 1, wherein the first set of transistors and the second set of transistors comprise p-channel transistor devices.

9. The method of claim 1, wherein the first set of transistors and the second set of transistors comprise n-channel transistor devices.

10. The method of claim 1, wherein the first and second sets of transistors reduce a leakage current from the power supply to a circuit device when the first and second sets of transistors are inactive.

11. The method of claim 1, further comprising:
    selectively activating a third set of transistors during the first power up stage to pre-charge a second power rail to a supply voltage level that is approximately equal to half of the voltage level of the power supply; and
    activating a fourth set of transistors during the second power up stage after at least one transistor of the third set of transistors is activated using a second feedback loop that couples the fourth set of transistors to the third set of transistors.

12. A system comprising:
    a first power domain responsive to a first power switching circuit;
    a second power domain responsive to a second power switching circuit; and
    a logic circuit adapted to selectively activate the first power switching circuit and the second power switching circuit;

wherein at least one of the first power switching circuit and the second power switching circuit includes a first set of transistors adapted for activation during a first power up stage and a second set of transistors adapted for activation during a second power up stage after at least one of the first set of transistors are activated, wherein each transistor of the first and second sets of transistors comprises a first terminal coupled to a power supply, a control terminal, and a second terminal coupled to a power rail of a circuit, wherein the control terminals of the first set of transistors are coupled to the control terminals of the second set of transistors.

13. The system of claim 12, wherein the first power domain comprises a plurality of memory cells.

14. The system of claim 12, wherein the first power domain comprises a discrete circuit device, an electrical load, a sub-circuit, a driver circuit, another circuit device, or any combination thereof.

15. The system of claim 12, wherein the logic circuit further comprises a decoder to selectively deactivate at least one of the first power domain and the second power domain.

16. A method of providing power to a circuit device, the method comprising:
 during a first stage, selectively activating a first set of transistors and drawing a first current having a first signal characteristic; and
 during a second stage, activating a second set of transistors after at least one transistor of the first set of transistors is activated during the first stage, wherein the activation of the second set of transistors is performed in response to a signal sent via a feedback loop having a circuit delay component coupled to a gate of the at least one transistor of the first set of transistors and drawing a second current having a second signal characteristic, the second signal characteristic including a saw tooth type pattern.

17. The method of claim 16, wherein during a third stage, drawing a third current having a third signal characteristic.

18. The method of claim 16, wherein the first signal characteristic comprises a current level that is substantially constant.

19. The method of claim 16, wherein the first stage comprises a power up stage associated with activation of the first set of transistors, and wherein the second stage comprises a power up stage associated with activation of the second set of transistors.

20. The method of claim 19, wherein the saw tooth type pattern comprises a number of saw tooth signal elements corresponding to a number of transistors of at least the second set of transistors.

21. The method of claim 16, wherein the circuit delay component is adapted to couple each gate of the second set of transistors to the gate of the at least one transistor of the first set of transistors.

22. A wireless communication device comprising:
 an antenna;
 a wireless controller coupled to the antenna;
 a processor coupled to the wireless controller;
 a power switching circuit including a first set of transistors and a second set of transistors; and
 a power control logic circuit coupled to the power switching circuit and adapted to selectively activate the first set of transistors during a first power up stage and to activate the second set of transistors during a second power up stage after at least one transistor of the first set of transistors is activated, wherein the second set of transistors is activated responsive to a signal sent via a feedback loop having a circuit delay component coupled to a gate of the at least one transistor of the first set of transistors.

23. The wireless communication device of claim 22, wherein the power switching circuit is coupled to a power domain of a circuit device.

24. The wireless communication device of claim 23, wherein the circuit device comprises a portion of a memory.

25. The wireless communication device of claim 23, wherein the circuit device comprises a portion of a digital signal processor.

26. Means for providing power to a device, comprising:
 first means for selectively activating a first set of transistors during a first power up stage to precharge a power rail to a voltage level that is less than a supply voltage level of a power supply; and
 second means for activating a second set of transistors during a second power up stage after at least one transistor of the first set of transistors is activated during the first power up stage, wherein the second set of transistors is activated responsive to a signal sent via a feedback loop having a circuit delay component coupled to a gate of the at least one transistor of the first set of transistors.

* * * * *